United States Patent
Wang et al.

(10) Patent No.: US 8,525,481 B2
(45) Date of Patent: Sep. 3, 2013

(54) DEVICE FOR MEASURING BATTERY VOLTAGE

(75) Inventors: Tao Wang, Shenzhen (CN); Yong-Song Shi, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 810 days.

(21) Appl. No.: 12/717,965

(22) Filed: Mar. 5, 2010

(65) Prior Publication Data
US 2010/0225326 A1    Sep. 9, 2010

(30) Foreign Application Priority Data
Mar. 6, 2009   (CN) .......................... 2009 1 0300738

(51) Int. Cl.
*H02J 7/00* (2006.01)
*H02J 7/16* (2006.01)

(52) U.S. Cl.
USPC ........... 320/134; 320/132; 320/135; 320/136; 320/137

(58) Field of Classification Search
USPC ................. 320/127, 128, 129, 132, 133, 134, 320/135, 136; 324/425, 426, 427, 428, 429, 324/430, 431, 432, 433, 434
See application file for complete search history.

(56) References Cited

U.S. PATENT DOCUMENTS

| | | | |
|---|---|---|---|
| 5,587,660 A | 12/1996 | Chabbert et al. | |
| 5,959,437 A * | 9/1999 | Hamaguchi | 320/134 |
| 6,163,132 A * | 12/2000 | Higuchi et al. | 320/132 |
| 6,252,377 B1 | 6/2001 | Shibutani et al. | |
| 6,340,880 B1 * | 1/2002 | Higashijima et al. | 320/162 |
| 6,897,635 B2 | 5/2005 | Ozawa et al. | |
| 7,692,400 B2 * | 4/2010 | Kanouda et al. | 320/101 |
| 7,960,945 B1 * | 6/2011 | Onorato et al. | 320/132 |
| 8,253,419 B2 * | 8/2012 | Heeringa et al. | 324/434 |
| 2004/0227488 A1 * | 11/2004 | Odaohhara | 320/127 |
| 2005/0225295 A1 * | 10/2005 | Sato | 320/132 |
| 2006/0103349 A1 * | 5/2006 | Yamamoto | 320/116 |
| 2006/0220461 A1 * | 10/2006 | Miyamoto | 307/43 |
| 2007/0229035 A1 * | 10/2007 | Fukute et al. | 320/132 |
| 2009/0058365 A1 * | 3/2009 | Goto | 320/134 |
| 2009/0200986 A1 * | 8/2009 | Kopera | 320/134 |
| 2009/0243621 A1 * | 10/2009 | Kudo et al. | 324/426 |
| 2009/0278501 A1 * | 11/2009 | Ho | 320/134 |

* cited by examiner

*Primary Examiner* — Edward Tso
*Assistant Examiner* — Alexis Boateng
(74) *Attorney, Agent, or Firm* — Altis Law Group, Inc.

(57) ABSTRACT

A device is used for measuring an output voltage of a battery. The device includes a detecting circuit, an encoding circuit, a control circuit, and a processing circuit. The detecting circuit is configured for detecting the output voltage of the battery and generating a first signal, a second signal, and a third signal accordingly. The encoding circuit is configured for generating a first code and a second code according to the first signal and the second signal. The control unit is configured for modifying the second code when the third signal indicates that the output voltage is lower than a predetermined value. The processing unit is configured for generating and outputting display control signals according to the first and second codes. The display control signals are used to control a display panel to display information of the output voltage of the battery.

15 Claims, 2 Drawing Sheets

DEVICE FOR MEASURING BATTERY VOLTAGE

BACKGROUND

1. Technical Field

Embodiments of the present disclosure relate to a device for measuring an output voltage of a battery in an electronic device.

2. Description of Related Art

Batteries, especially rechargeable batteries, such as nickel-hydrogen storage batteries, lithium-ion batteries, etc., are widely used as power sources for various electronic devices. When the output voltage of a battery used by an electronic device is too small to drive the electronic device, the electronic device cannot work. Therefore, it is required to timely measure and indicate the output voltage across the battery terminals. Many electronic devices use a main/central processing unit chip, such as a microcontroller (MCU), to monitor and measure the output voltage of the battery. This function needs one or two dedicated ports of the MCU. Thus less ports are free and the MCU is not as efficient.

Therefore, an independent device for measuring the output voltage of a battery is needed.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
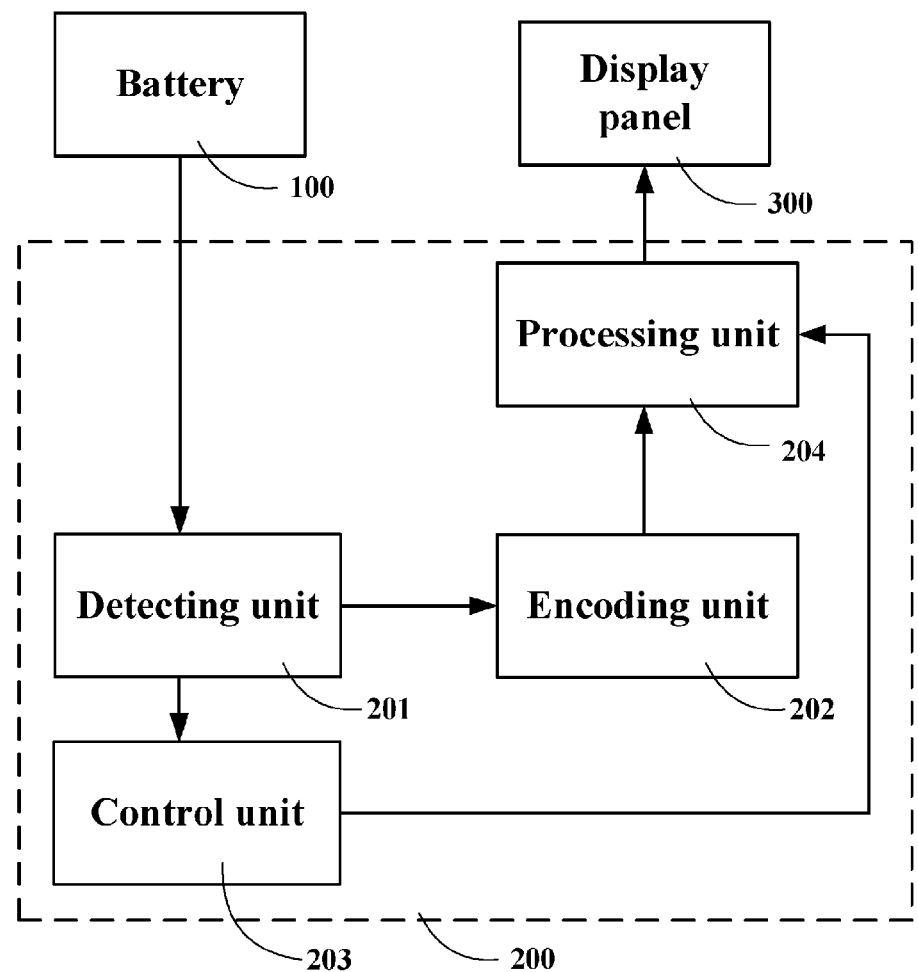
FIG. 1 is a block diagram of a device for measuring an output voltage of a battery in accordance with one embodiment of the present disclosure.

Referring to FIG. 1, a device 200 is used to measure an output voltage of a battery 100 and displaying the voltage level on a display panel 300. The battery 100 is used to power an electronic device (not shown). The device 200 and the display panel 300 are components of the electronic device. The electronic device may be a mobile phone, a laptop computer, or a media player.

The device 200 includes a detecting unit 201, an encoding unit 202, a control unit 203, and a processing unit 204. The detecting unit 201 is configured to detect the output voltage of the battery 100, and generate a first signal, a second signal, and a third signal accordingly. In the embodiment, the first, second, and third signals are voltages which are in proportion to the output voltage of the battery 100. The first signal is always greater than the second signal. The third signal is always greater than the first signal.

The encoding unit 202 is configured to generate a first code and a second code according to the first signal and the second signal. In the embodiment, the first code is logic "0" when the first signal is greater than a reference voltage, and is logic "1" when the first signal is lower than the reference voltage. The second code is logic "0" when the second signal is greater than the reference voltage, and is logic "1" when the second signal is lower than the reference voltage.

The control unit 203 is configured to modify the second code when the third signal indicates that the output voltage of the battery 100 is lower than a third preset value. In the embodiment, when the output voltage is lower than the third preset value, the first and second signals are both lower than the reference voltage, and the control unit 203 sets the second code to logic "0".

The processing unit 204 is configured to generate and output display control signals according to the first and second codes. The display control signals are used to control the display panel 300 to display the voltage level of the battery 100. In the embodiment, the processing unit 204 includes a digital signal processing integrated circuit (DSP IC).

Figure 2:
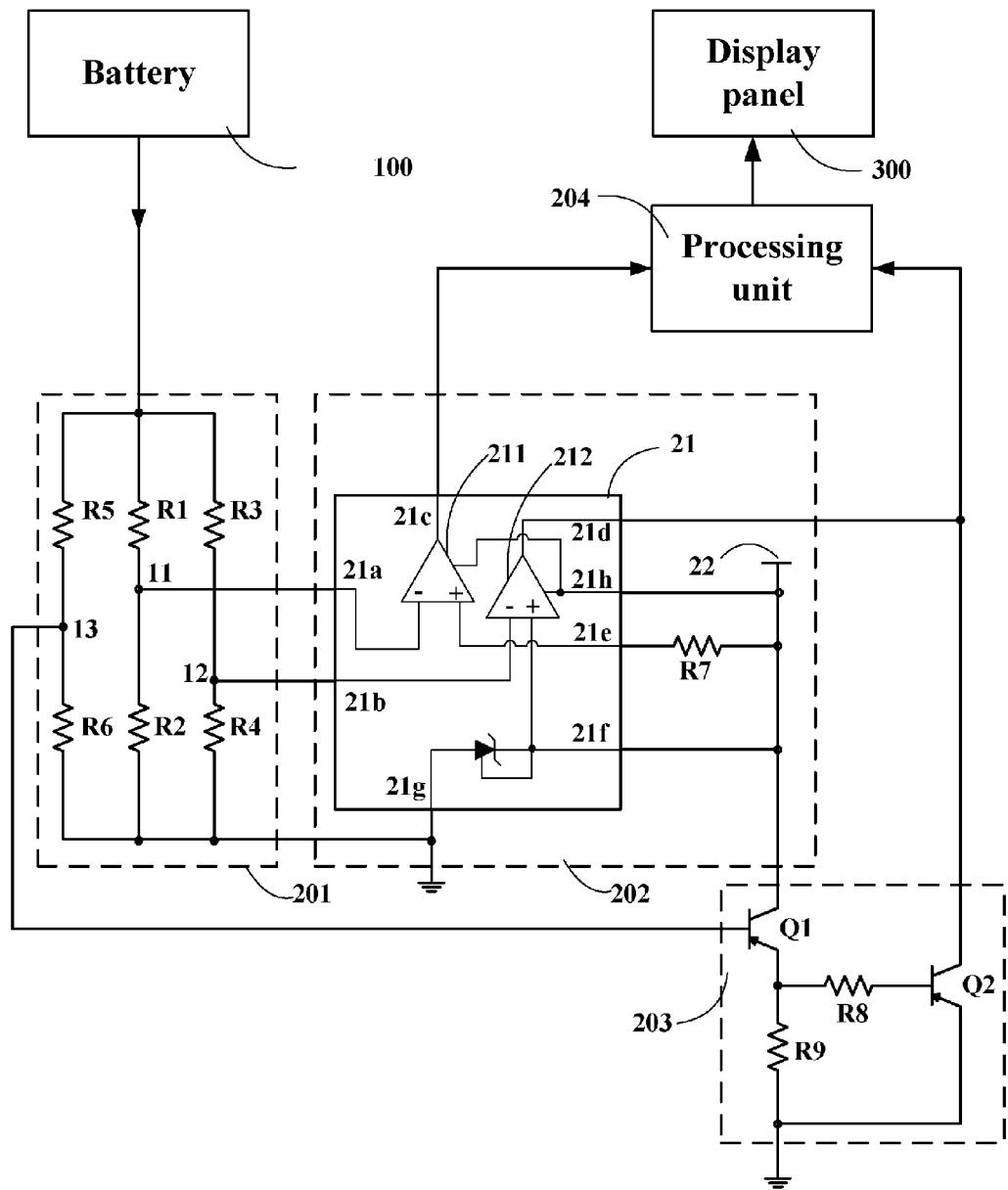
FIG. 2 is a schematic circuit diagram of the device of FIG. 1.

Referring to FIG. 2, in one embodiment, the detecting unit 201 includes a first resistor R1, a second resistor R2, a third resistor R3, a fourth resistor R4, a fifth resistor R5, a sixth resistor R6, a first output terminal 11 for outputting the first signal, a second output terminal 12 for outputting the second signal, and a third output terminal 13 for outputting the third signal. The first and second resistors R1, R2 are connected in series between the positive pole of the battery 100 and ground. The third and fourth resistors R3, R4 are connected in series between the positive pole of the battery 100 and ground. The fifth resistor R5 and the sixth resistor R6 are connected in series between the positive pole of the battery 100 and ground. The first output terminal 11 is connected to a first node between the first and second resistors R1, R2. The second output terminal 12 is connected to a second node between the third and fourth resistors R3, R4. The third output terminal 13 is connected to a third node between the fifth and sixth resistors R5, R6. The value of R6/(R5+R6) is greater than the value of R2/(R1+R2). The value of R2/(R1+R2) is greater than the value of R4/(R3+R4).

The encoding unit 202 includes an integrated circuit (IC) 21 and a seventh resistor R7. The IC 21 is integrated with a first operational amplifier (op-amp) 211 and a second op-amp 212. The IC 21 also includes eight pins 21a-21h. Pin 21a is connected to the inverting input terminal of the first op-amp 211, and is configured to receive the first signal. Pin 21b is connected to the inverting input terminal of the second op-amp 212, and is configured to receive the second signal. Pin 21c is connected to the output terminal of the first op-amp 211 to output the first code. Pin 21d is connected to the output terminal of the second op-amp 212 to output the second code. Pin 21e is connected to the non-inverting input terminal of the first op-amp 211 and a power supply 22 via the seventh resistor R7. Pin 21f is connected to the non-inverting input terminal of the second op-amp 212 and the power supply 22. Pin 21g is connected to the negative power terminal of the first and second op-amps 211, 212, and is also grounded. Pin 21h is connected to the positive power terminal of the first and second op-amps 211, 212 and is also coupled to the power supply 22. A Zener diode is connected between pin 21f and pin 21g. Thus, when the power supply 22 supplies an operation voltage to pin 21f, a voltage at pin 21f (the non-inverting input terminal of the second op-amp 212) is wired to the Zener voltage of the Zener diode, that is, the reference voltage as described above.

The control unit 203 includes a first switching component Q1, a second switching component Q2, a eighth resistor R8, and a ninth resistor R9. In the embodiment, the first and second switching components Q1, Q2 are both NPN type bipolar junction transistors. In other embodiments, the first and second switching components Q1, Q2 may be field effect transistors (FET), insulated gate bipolar transistors (IGBT), or other transistors.

The collector of the first switching component Q1 is connected to the power supply 22 to receive the operation voltage. The emitter of the first switching component Q1 is grounded via the ninth resistor R9. The base of the first switching component Q1 is connected to the third output terminal 13 of the detecting unit 201 to receive the third signal. The collector of the second switching component Q2 is connected to pin 21d and the encoding unit to modify the second code. The emitter of the second switching component Q2 is grounded. The base of the second switching component Q2 is connected to the emitter of the first switching component Q1 via the eighth resistor R8.

In operation, assuming the maximum output voltage of the battery 100 is QC. When the output voltage is greater than a first preset value, the first and second signals are both greater than the reference voltage, and the third signal is a high level voltage. Therefore, the first code and the second code are logic "0". The processing unit 204 may control the display panel 300 to display an image of a battery including four black blocks representing or indicating the level of the output voltage of the battery. In this embodiment, when the battery is more than three-fourths charged, the four blocks fill the battery image.

When the output voltage is greater than a second preset value and lower than the first preset value, the first signal is greater than the reference voltage, the second signal is lower than the reference voltage, and the third signal is also considered as a high level voltage. Therefore, the first code is logic "0", and the second code is logic "1". The processing unit 204 may control the display panel 300 to display an image of the battery including three black blocks.

When the output voltage is greater than the third preset value and lower than the second preset value, the first and second signals are both lower than the reference voltage, and the third signal is also considered as a high level voltage. Therefore, the first code and the second code are both logic "1". The processing unit 204 may control the display panel 300 to display an image of the battery including two black blocks to indicate that the battery voltage is low.

When the output voltage is lower than the third preset value, the first and second signals are both lower than the reference voltage, and the third signal becomes a low level voltage. Therefore, the first code is logic "1", the first switching component Q1 is turned on to apply the operation voltage to the base of the second switching component Q2. Thus the second switching component Q2 is turned on to ground pin 21d. As a result, the second code is changed to logic "0". The processing unit 204 may control the display panel 300 to display an image of the battery including one black block to indicate that the battery voltage is severely low and the battery 100 should be charged or replaced.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A device for measuring an output voltage of a battery, the device comprising:
    a detecting unit for detecting the output voltage and generating a first signal, a second signal, and a third signal accordingly;
    an encoding unit for generating a first code and a second code according to the first signal and the second signal;
    a control unit for modifying the second code when the third signal indicates that the output voltage is lower than a predetermined value; and
    a processing unit for generating and outputting display control signals according to the first code and the modified second code, the display control signals being used to control a display panel to display information of the output voltage of the battery;
    wherein the detecting unit comprises a first resistor, a second resistor, a third resistor, a fourth resistor, a first output terminal for outputting the first signal, and a second output terminal for outputting the second signal, the first and second resistors are connected in series between the positive pole of the battery and ground, the third and fourth resistors are connected in series between the positive pole of the battery and ground, the first output terminal is connected to a first node between the first and second resistors, the second output terminal is connected to a second node between the third and fourth resistors; the detecting unit further comprises a fifth resistor and a sixth resistor connected in series between the positive pole of the battery and ground, and a third output terminal for outputting the third signal, the third output terminal is connected to a third node between the fifth and sixth resistors.

2. The device of claim 1, wherein the encoding unit comprises an integrated circuit (IC), the IC comprises an independent first operational amplifier (op-amp) and a second op-amp.

3. The device of claim 2, wherein the encoding unit further comprises a seventh resistor, and a positive power terminal for operationally receiving an operation voltage, the first op-amp comprises a first inverting input terminal for receiving the first signal, a first non-inverting input terminal coupled to the voltage input terminal via the seventh resistor, and a first output terminal for outputting the first code, the second op-amp comprises a second inverting input terminal for receiving the second signal, a second non-inverting input terminal connected to the voltage input terminal, and a second output terminal for outputting the second code, the second non-inverting input terminal is wired to a reference voltage.

4. The device of claim 3, wherein when the first and second signals are both greater than the reference voltage, the first code and the second code are logic "0".

5. The device of claim 3, wherein when the first signal is greater than the reference voltage and the second signal is lower than the reference voltage, the first code is logic "0", and the second code is logic "1".

6. The device of claim 3, wherein when the first and second signals are both lower than the reference voltage, the first code and the second code are logic "1".

7. The device of claim 3, wherein when the first and second signals are both lower than the reference voltage, and the output voltage is lower than the predetermined value, the first code is logic "1", and the modified second code is logic "0".

8. The device of claim 1, wherein the control unit comprises a first switching component, a second switching component, an eighth resistor, and a ninth resistor, a first terminal of the first switching component is connected to a voltage input terminal for operationally receiving an operation voltage, a second terminal of the first switching component is grounded via the ninth resistor, a control terminal of the first switching component is configured to receive the third signal, a first terminal of the second switching component is connected to the encoding unit to modify the second code, a second terminal of the second switching component is grounded, a control terminal of the second switching component is connected to the second terminal of the first switching component via the eighth resistor.

9. The device of claim 8, wherein the first and second switching components are NPN type bipolar junction transistors (BJTs), the first terminals of the BJTs are collectors, the second terminals of the BJTs are emitters, the first and second control terminals of the BJTs are bases.

10. A device for measuring an output voltage of a battery, the device comprising:
   a detecting circuit for detecting the output voltage of the battery and generating a first detected voltage, a second detected voltage, and a third detected voltage accordingly;
   an encoding circuit comprising a first independent chip for generating a first code and a second code according to the first and second detected voltages;
   a control circuit for setting the second code to a default state when the third detected voltage indicates that the output voltage is lower than a predetermined value; and
   a processing circuit comprising a second independent chip for generating and outputting display control signals according to the first code and the set second code, the display control signals being used to control a display panel to display information of the output voltage of the battery;
   wherein the first independent chip comprises a first operational amplifier (op-amp) and a second op-amp; the encoding circuit further comprises a seventh resistor, and a voltage input terminal for operationally receiving an operation voltage, the first op-amp comprises a first inverting input terminal for receiving the first detected voltage, a first non-inverting input terminal coupled to the voltage input terminal via the seventh resistor, and a first output terminal for outputting the first code, the second op-amp comprises a second inverting input terminal for receiving the second detected voltage, a second non-inverting input terminal connected to the voltage input terminal, and a second output terminal for outputting the second code, the second non-inverting input terminal is wired to a reference voltage.

11. The device of claim 10, wherein the control circuit comprises a first switching component, a second switching component, an eighth resistor, and a ninth resistor, a first terminal of the first switching component is connected to a voltage input terminal for operationally receiving an operation voltage, a second terminal of the first switching component is grounded via the ninth resistor, a control terminal of the first switching component is configured to receive the third detected voltage, a first terminal of the second switching component is connected to the encoding unit to modify the second code, a second terminal of the second switching component is grounded, a control terminal of the second switching component is connected to the second terminal of the first switching component via the eighth resistor.

12. The device of claim 1, wherein the encoding unit compares the first signal with a reference voltage to generate the first code, and the encoding unit further compares the second signal with the reference voltage to generate the second code.

13. The device of claim 10, wherein the encoding unit compares the first detected voltage with a reference voltage to generate the first code, and the encoding unit further compares the second detected voltage with the reference voltage to generate the second code.

14. The device of claim 1, wherein the processing unit further generates and outputs display control signals according to the first code and the second code.

15. The device of claim 10, wherein the second independent chip is used for generating and outputting the display control signals according to the first code and the second code.

* * * * *